United States Patent [19]
Knigga et al.

[11] Patent Number: 5,527,999
[45] Date of Patent: Jun. 18, 1996

[54] MULTILAYER CONDUCTOR FOR PRINTED CIRCUITS

[75] Inventors: Bradley R. Knigga, Russiaville; Christine A. Paszkiet, Kokomo, both of Ind.

[73] Assignee: Delco Electronics Corp., Kokomo, Ind.

[21] Appl. No.: 391,740

[22] Filed: Feb. 21, 1995

[51] Int. Cl.$^6$ ........................................ H05K 1/00
[52] U.S. Cl. ...................... 174/261; 174/262; 174/264; 174/260; 174/250
[58] Field of Search ..................... 174/250, 255, 174/261, 262, 260, 264; 361/767

[56] References Cited

U.S. PATENT DOCUMENTS

| | | | |
|---|---|---|---|
| 4,047,290 | 9/1977 | Weitze et al. | 29/625 |
| 4,511,757 | 4/1985 | Ors et al. | 174/68.5 |
| 4,713,493 | 12/1987 | Oikawa et al. | 174/68.5 |
| 5,185,502 | 2/1993 | Shepherd et al. | 174/262 |
| 5,293,005 | 3/1994 | Yamamura | 174/251 |
| 5,298,686 | 3/1994 | Bourdelaise et al. | 174/254 |
| 5,298,687 | 3/1994 | Rapaport et al. | 174/261 |
| 5,320,894 | 6/1994 | Hasegawa | 428/137 |
| 5,389,743 | 2/1995 | Simila et al. | 174/262 |

*Primary Examiner*—Laura Thomas
*Attorney, Agent, or Firm*—Mark A. Navarre

[57] ABSTRACT

A multilayer circuit is provided characterized by a multilayer conductor structure. The multilayer conductor structure is composed of at least two conductor layers, with each adjacent layer being separated by a dielectric material in the form of one or more dielectric layers. The multilayer circuit further includes electrically conductive members or features for electrically interconnecting the conductor layers at two or more locations along the lengths of the conductor layers. As a result, portions of the conductor layers between two or more locations are electrically in parallel with each other, such that the multilayer conductor is characterized by an electrical resistance between the locations which is less than the electrical resistance of the individual conductor layers between the locations. The multilayer conductor is therefore characterized by an augmented current-carrying capacity as compared to a single layer conductor of the same length and width.

19 Claims, 2 Drawing Sheets

MULTILAYER CONDUCTOR FOR PRINTED CIRCUITS

The present invention generally relates to conductor runners for multilayer printed circuits. More particularly, this invention relates to a hybrid multilayer printed circuit in which circuit devices are electrically interconnected with conductors runners composed of multiple conductor layers separated by one or more dielectric layers in order to form parallel conductor paths, yielding a multilayer conductor runner characterized by enhanced electrical conductivity.

BACKGROUND OF THE INVENTION

In the construction of a thick film hybrid circuit, it is generally desirable to position the circuit components of the circuit as close to each other as possible, which maximizes component density and minimizes the size of the hybrid circuit. One known method for achieving a high component density for a thick film hybrid circuit is to place conductors, which make electrical interconnects between circuit devices, within a multilayer structure composed of layers of metal runners interlaid with layers of an electrically insulating, or dielectric, material. Successive layers of metal runners are electrically insulated from each other with an intermediate layer of the dielectric material, with metallized holes, or vias, being provided to electrically interconnect metal runners with their corresponding bond pads at the surface of the multilayer structure. The multilayer structure is supported with a suitable substrate which provides structural support for the hybrid circuit.

While multilayer hybrid circuits are advantageous from the standpoint of maximizing component density, they place significant design constraints on the placement and width of certain conductor runners. The current-carrying capacity of printed conductor runners in a hybrid circuit is affected by both the choice of conductor composition and by the runner design. For example, in critical areas such as the narrow regions of attachment for integrated circuit chips, the design of a surface mount package may limit the width of the conductor runners with which it must register. While conductor compositions are commercially available that offer a range of sheet resistances, those characterized by being more readily wire-bondable generally have relatively higher sheet resistances. As a result, those conductor compositions best suited to be wire bonded with surface mount packages exacerbate the already reduced current-carrying capacity of a runner whose width is limited by its surface mount package. Under some circumstances, the width of a runner may be limited to the extent that its current-carrying capability is marginal, even if the runner is printed with the highest conductivity conductor composition that is available and compatible with the rest of the circuit.

Accordingly, what is needed is a thick film hybrid circuit that is configured to promote optimum component density, while also achieving enhanced current-carrying capacity for its printed conductor runners, particularly where the width of a conductor runner is severely limited.

SUMMARY OF THE INVENTION

It is an object of this invention to provide a multilayer circuit, and particularly a thick film hybrid multilayer circuit, that is configured to achieve enhanced current-carrying capacity for one or more of its conductor runners.

it is a further object of this invention that such enhanced current-carrying capacity is achievable even where the circuit is configured to promote optimum component density.

It is another object of this invention that such enhanced current-carrying capacity is achievable where the width of a conductor runner is severely limited by constraints imposed by the multilayer circuit and/or its devices.

It is another object of this invention that the current-carrying capacity of a conductor runner be promoted, yet not to the detriment of the reliability with which surface mount devices can be bonded to the conductor runner.

In accordance with a preferred embodiment of this invention, these and other objects and advantages are accomplished as follows.

According to the present invention, there is provided a multilayer circuit that utilizes a multilayer conductor structure. The multilayer conductor structure is composed of at least two conductor layers, with each adjacent layer being separated by a dielectric material in the form of one or more dielectric layers. The multilayer circuit further includes electrically conductive members or features for electrically interconnecting the conductor layers at two or more locations along their lengths. As a result, portions of the conductor layers between the two or more locations are electrically in parallel to each other, though not necessarily geometrically in parallel. Because the conductor layers form parallel conduction paths, the multilayer conductor is characterized by an electrical resistance between the locations which is less than the electrical resistance of the individual conductor layers between the locations. Therefore, the present invention is capable of augmenting the current-carrying capacity of conductor runners, such as those in critical areas of a multilayer circuit, by electrically connecting sections of runners to conductor runners on different levels of the multilayer circuit.

In a preferred embodiment, the multilayer circuit is a thick film hybrid multilayer circuit provided with circuit devices that are electrically interconnected with the multilayer conductor at or near one of the locations at which the conductor layers are interconnected. The multilayer conductor can be one of a plurality of multilayer conductors that form a conductor pattern for registering with a circuit device. As a result, this invention enables one or more conductors of a conductor pattern to be highly conductive, even where the widths of the conductors are severely limited by the circuit device with which the conductor pattern is to be registered.

Another significant advantage of this invention is that the conductor layers may be formed from differing material, enabling the selection of compositions having different electrical conductivities and wire-bonding characteristics. As a result, a multilayer conductor can be formed using a relatively high resistance top conductor layer that is readily wire-bondable and a lower resistance bottom conductor layer, yielding a multilayer conductor characterized by relatively low electrical resistance, yet with the desirable processing and/or property characteristics of the top conductor.

Yet another advantage of this invention is that the multilayer conductor and its multilayer circuit can be formed using known hybrid materials and known processing m..hods, such as well known printing, trimming, soldering and reflow techniques used in the electronics industry. As a result, hybrid circuits processed in accordance with this invention can be mass produced for use in such industries as the automotive industry.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
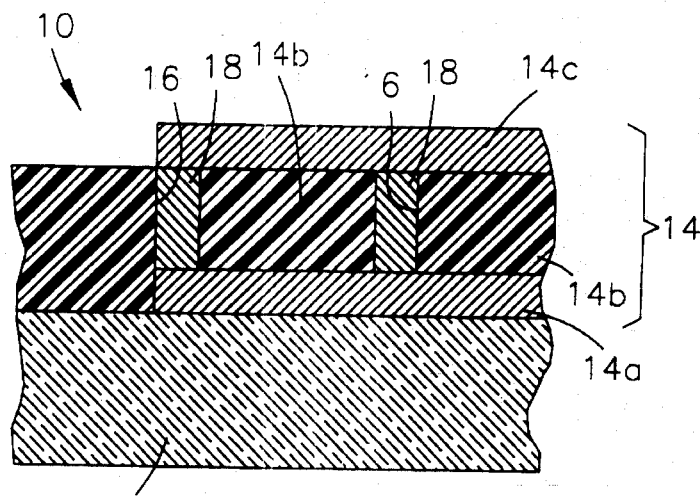
FIG. 1 shows, in cross-section, a multiple layer conductor runner in accordance with this invention.

A portion of a thick film hybrid multilayer circuit 10 in accordance with a first embodiment of this invention is shown in FIG. 1. Illustrating a key aspect of this invention, FIG. 1 shows the hybrid multilayer circuit 10 in cross-section as including a multilayer conductor 14 supported by a substrate 12. The substrate 12 is preferably formed from a ceramic material, such as an alumina ceramic of the type often utilized in the electronics industry. Those skilled in the art will appreciate the teachings of this invention are generally applicable to other forms of multilayer circuits, including printed circuit boards.

The multilayer conductor 14 includes a bottom conductor layer 14a, a top conductor layer 14c and a dielectric layer 14b intermediate the bottom and top conductor layers 14a and 14c. The conductor layers 14a and 14c are generally in the form of traces or runners having a limited width in order to maximize the number of runners that can be accommodated on the surface of the hybrid multilayer circuit 10. The dielectric layer 14b can be in the form of a single layer composed of a dielectric material, or any number of discrete layers composed of one or more different dielectric materials. Holes or vias 16 are provided in the dielectric layer 14b through which metallization 18 extends to electrically interconnect the conductor layers 14a and 14c. As a result, the portions of the conductor layers 14a and 14c between the metallizations 18 are electrically in parallel, in effect forming resistors in parallel whose sum resistance is less than that of the least resistant portion according to the formula:

$$R_{eff} = R_t R_b / (R_t + R_b)$$

where $R_t$ is the resistance value of the top conductor layer 14c, $R_b$ is the resistance value of the bottom conductor layer 14a, and $R_{eff}$ is the effective resistance of the bottom and top conductor layers 14a and 14c in parallel. As such, the multilayer conductor 14 is characterized by an enhanced current-carrying capacity that, particularly in critical areas of the multilayer circuit 10, can be used to further reduce electrical resistance in situations where conductor materials and design have already been optimized to minimize resistance.

An example of such circumstances is represented in FIG. 2, which represents the fabrication of a conductor pattern for an integrated circuit surface mount package. FIG. 2a is a plan view of a substrate, such as an alumina wafer, in a critical area of a circuit—i.e., the conductor pattern for a surface mount package where the widths of the conductors must be minimized in order to accommodate all of the required conductors within a minimal amount of surface area on the surface of the circuit. At a first level shown in FIG. 2b, bottom conductors 14a are formed by printing a suitable conductor paste onto the surface of the substrate 12, followed by a conventional firing. As illustrated, only those runners whose current-carrying capability are particularly critical to the operation of the surface mount package need be provided with bottom conductors 14a in order to form a multilayer conductor 14 of the type shown in FIG. 1. The locations for the remainder of the runners are shown in phantom in FIG. 2b.

Figure 2A:
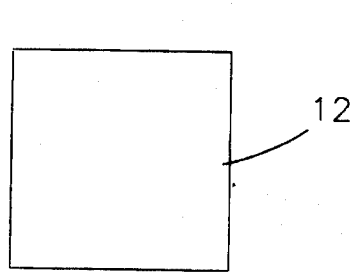
FIGS. 2a–2e represent in plan view the implementation of the invention for use with an integrated circuit device in accordance with one embodiment of this invention.
Figure 2B:
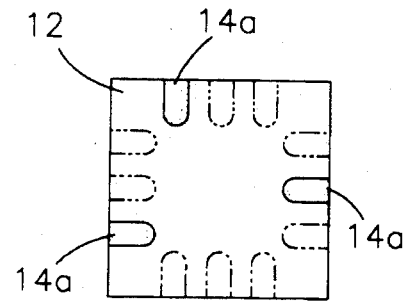
Figure 2C:
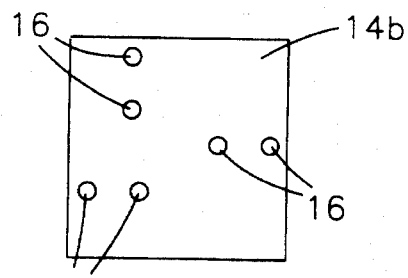
Figure 2D:
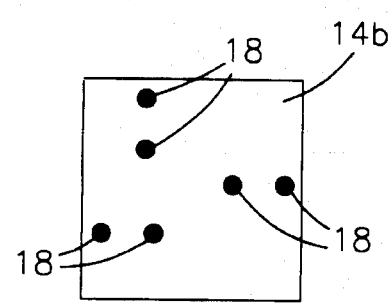
Figure 2E:
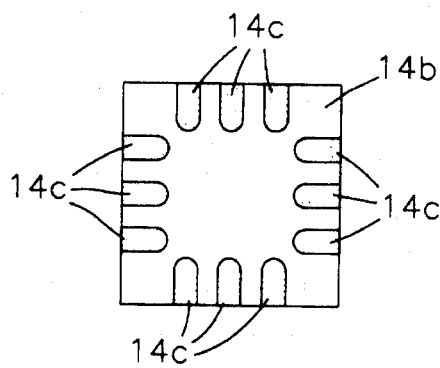

Thereafter, as shown in FIG. 2c, a dielectric layer 14b is deposited over the entire substrate 12, with vias 16 being formed through the dielectric layer 14b in order to gain access to the bottom conductors 14a. After firing the dielectric layer 14b, the vias 16 are filled with a suitable conductive paste, and the structure is again fired to form metallizations 18 within the vias 16, as shown in FIG. 2d. Finally, top conductors 14c are formed by printing and firing a suitable conductor paste onto the surface of the substrate dielectric layer 14b, thereby forming the conductor pattern shown in FIG. 2e.

An important feature of this invention is that the bottom and top conductors 14a and 14c need not be formed from the same conductor paste composition, but can be formed from different paste compositions in order to exploit the advantageous properties of various conductor compositions. For example, for integrated circuit devices mounted using wire bonding techniques, the top conductors 14c are preferably formed from compositions that are readily wire-bondable, such as a conductor paste composition available from the DuPont Company of Wilmington, Del., under the name DuPont 7484. Such compositions generally have higher sheet resistances than other compositions, such as another conductor paste composition available from DuPont under the name DuPont QS179. In accordance with the present invention, the top conductors 14c can be formed from compositions such as DuPont 7484 in order to take advantage of its wire-bonding properties, while the bottom conductors 14a can be formed from a lower resistance composition such as DuPont QS179 in order to minimize the resistance of the multilayer conductor 14 formed by the conductors 14a and 14c.

Figure 3:
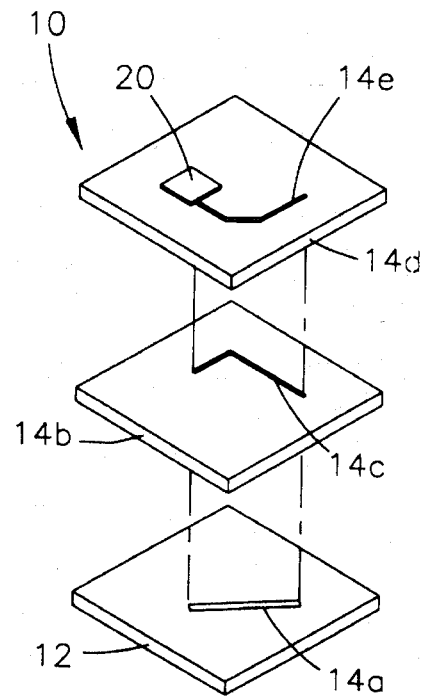
FIG. 3 is an exploded perspective view of the invention in accordance with another embodiment of this invention.

While FIGS. 1 and 2 illustrate the use of a single pair of conductor layers, it is foreseeable that any number of conductor layers could be used to conduct input and output signals to a circuit device 20, as illustrated by the multilayer circuit 10 shown in FIG. 3. The multilayer circuit 10 of FIG. 3 illustrates three conductors 14a, 14c and 14e that are formed at different levels of the multilayer circuit 10. Specifically, the bottom conductor 14a is formed directly on a substrate 12, the intermediate conductor 14c is formed on a lower dielectric layer 14b, and the top conductor 14e is formed on an upper dielectric layer 14d. Notably, the conductors 14a, 14c and 14e are shown as not being geometrically parallel to each other so as to illustrate the manner in which the individual conductors 14a, 14c and 14e can be uniquely routed within their respective levels in order to achieve efficient use of surface area and to avoid circuit elements such as capacitors and resistors within their respective levels, yet remain electrically in parallel for the purpose of reducing the resistance of the multilayer conductor formed by the conductors 14a, 14c and 14e.

To evaluate the improvements made possible by the teachings of this invention, conductor patterns were generated on a number of alumina substrates, one substrate 112 of which is represented in FIGS. 4a through 4d. Conductor runners were formed on each substrate 112 in one of four distinct configurations, identified as Configurations A, B, C and D and described below. The representation of FIGS. 4a through 4d are not to scale, but generally convey the layout of the test specimens.

Figure 4A:
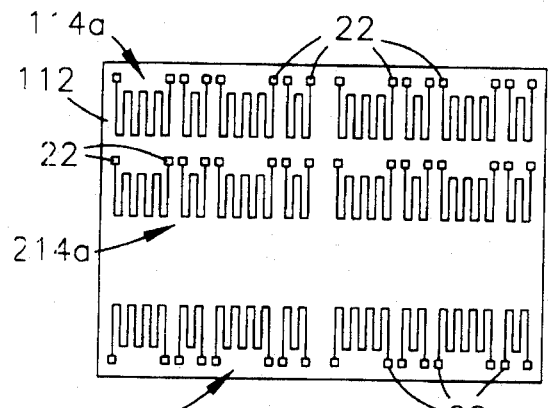
FIGS. 4a–4d represent in plan view the construction of test specimens prepared for the purpose of evaluating the present invention.
Figure 4B:
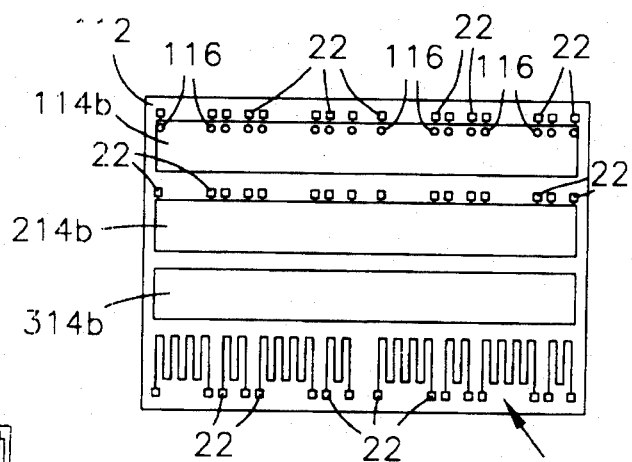
Figure 4C:
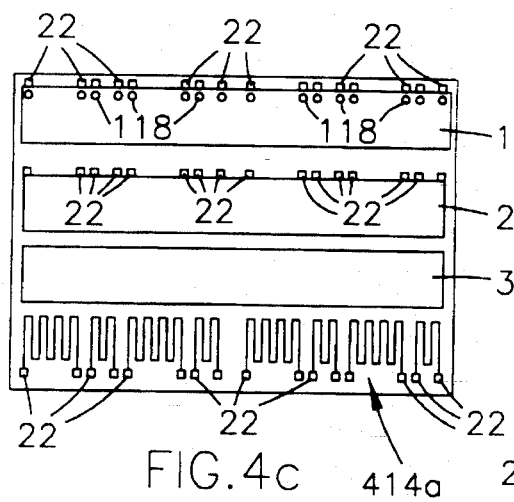
Figure 4D:
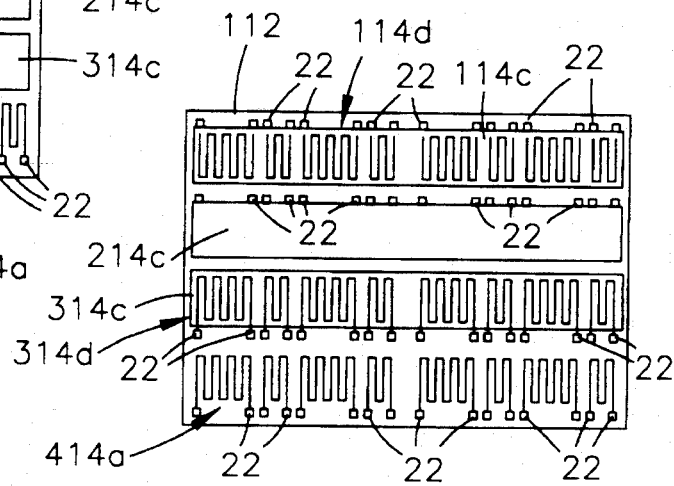

Conductor Configuration A, representative of this invention, is located at the top edge of the substrate 112 as shown in FIGS. 4a through 4d. For this configuration, eight discrete lower conductor runners 114a were printed directly onto the substrate 112 as shown in FIG. 4a. Each separate runner was equipped with two probe pads 22, each having a surface area of about 2.8 mm². The runners 114a were then covered with two sequentially printed dielectric layers 114b in the form of a band or strip of dielectric material, as shown in FIG. 4b. The probe pads 22 were also left exposed as shown in FIG. 4b in order to allow access to the pads 22 during subsequent testing. Vias 116 (not to scale) were included in the dielectric layers 114b, as also shown in FIG. 4b. The width of each via 116 corresponded to the width of its runner, while the length of each via 116 was about 0.5 millimeter. The vias 116 were filled with a conductor composition to form metallizations 118, as indicated in FIG. 4c, in order to provide electrical contacts to the lower runners 114a. A third dielectric layer 114c was then printed, and vias were formed to uncover the metallizations 118 as also indicated in FIG. 4c. Upper conductor runners 114d were then printed on the third dielectric layer 114c, as shown in FIG. 4d. During the process, some of the conductor composition flowed into the vias in the third dielectric layer 114c, thereby contacting the metallizations 118 and electrically interconnecting the lower and upper runners 114a and 114d. As a result, the lower and upper runners 114a and 114d were separated by three layers of dielectric material, whose combined thickness was on the order of about 0.07 millimeters.

Configuration B, located adjacent Configuration A, also included eight discrete lower conductor runners 214a and probe pads 22 printed directly onto the substrate 112, as shown in FIG. 4a. These runners 214a were also covered with two layers of dielectric 214b, with their probe pads 22 being left exposed as shown in FIG. 4b in order to allow access to the pads 22 during subsequent testing. A third dielectric layer 214c was then printed, as shown in FIG. 4c. As a result, the runners 214a were buried beneath three layers of dielectric material whose combined thickness was approximately that of the dielectric layers 114b and 114c.

Configuration C was composed of eight discrete conductor runners 314d printed on top of three layers of dielectric material, formed by two dielectric layers 314b, shown in FIG. 4b, and a third dielectric layer 314c, shown in FIG. 4c. As a result, the Configuration C runners 314d were formed on three layers of dielectric material whose combined thickness was again approximately that of the dielectric layers 114b and 114c. The runners 314d extended past the edge of the dielectric layers 314b and 314c, such that their probe pads 22 were printed directly on the substrate 112, as shown in FIG. 4d.

Finally, Configuration D was composed of eight discrete conductor runners 414a and probe pads 22 printed directly on the substrate 112, without being buried by any dielectric material.

In addition to the physical configurations described above, each conductor configuration was fabricated using one of two distinct conductor combinations. The first conductor combination used DuPont QS179 for all of the runners 114a, 114d, 214a, 314d and 414a. The second conductor combination used DuPont QS179 for the lower runners 114a, 214a and 414a and the via metallizations 118, while DuPont 7484 was used to form the upper runners 114d and 314d. A dielectric material available from DuPont under the name DuPont 5704H was used to form all of the dielectric layers 114b and 114c for the test specimens.

Finally, two different line widths and two different conductor trace lengths were also evaluated for each of the material combinations and in all configurations, as indicated in FIGS. 4a and 4d. The following combinations of line widths and pattern lengths, respectively, were employed: 0.58 millimeter and 117 millimeters; 0.58 millimeter and 57 millimeters; 0.28 millimeter and 117 millimeters; and 0.28 millimeter and 57 millimeters.

Testing of the conductor Configurations A through D consisted of measuring the resistance of each of the configurations between their respective probe pads 22. Table I below presents average values for sets of ten readings for each configuration and conductor combination.

TABLE 1

| | QS179 top/QS179 bottom | | | | 7484 top/QS179 bottom | | | |
|---|---|---|---|---|---|---|---|---|
| width: | 0.58 mm | 0.58 mm | 0.28 mm | 0.28 mm | 0.58 mm | 0.58 mm | 0.28 mm | 0.28 mm |
| length: | 117 mm | 57 mm | 117 mm | 57 mm | 117 mm | 57 mm | 117 mm | 57 mm |
| A (Ω) | 0.269 | 0.147 | 0.730 | 0.390 | 0.480 | 0.253 | 1.335 | 0.683 |
| (mΩ/□) | 1.3 | 1.5 | 1.7 | 1.9 | 2.4 | 2.6 | 3.2 | 3.3 |
| B (Ω) | 0.472 | 0.283 | 1.476 | 0.718 | 0.476 | 0.283 | 1.507 | 0.748 |
| (mΩ/□) | 2.4 | 2.9 | 3.5 | 3.5 | 2.4 | 2.9 | 3.6 | 3.7 |
| C (Ω) | 0.446 | 0.250 | 1.323 | 0.673 | 3.517 | 1.982 | 9.366 | 4.763 |
| (mΩ/□) | 2.2 | 2.6 | 3.2 | 3.3 | 27.6 | 20.4 | 22.4 | 23.3 |
| D (Ω) | 0.484 | 0.259 | 1.339 | 0.679 | 0.484 | 0.253 | 1.356 | 0.691 |
| (mΩ/□) | 2.4 | 2.6 | 3.2 | 3.3 | 2.4 | 2.6 | 3.2 | 3.4 |

As shown in the table, sheet resistance values (mΩ/□) calculated from measured resistances and runner dimensions were consistent within a given width. Sheet resistance values were higher for the 0.28 millimeter runners than for the wider 0.58 millimeter runners, probably because the narrower runners suffered a greater percentage decrease in cross-sectional area due to thinning near the edges than did the wider runners.

An important comparison for configurations fabricated with the QS179 conductor material as the material for all runners can be made between the resistances for Configurations A and C. Specifically, the resistances of the Configuration A multilayer runners (the combination of upper and lower runners 114d formed from the QS179 material) was on average about forty-three percent less than the Configuration C single layer runners (runners 314d formed from the QS179 material) having similar lengths and widths. The maximum theoretical decrease in resistance for the Configuration A multilayer runners is fifty percent, and is calculated assuming equal lengths and resistances of the lower and upper conductors 114a and 114d, as shown below:

$1/R_T = 1/R_1 + 1/R_2$

Assume $R_1 = R_2$ = Resistance of QS179 runner = R $1/R_T = 2/R$; Therefore, $R_T = R/2$ An important comparison for runners fabricated with both the 7484 and QS179 materials can also be made between the resistances for Configurations A and C. The resistance of the Configuration A multilayer runners (runners 114d formed from the 7484 material and runners 114a formed from the QS179 material) was on average about eighty-six percent less than the Configuration C single layer runners (runners 314d formed from the 7484 material) having similar lengths and widths. Because the lower runners 114a formed from the QS179 material provide a path of least resistance for the multilayer runners (due to the lower sheet resistance of the QS179 material), the resistance of these Configuration A runners approached that of a single layer runner formed from the QS179 material having similar lengths and widths.

From the above, it can be seen that the present invention provides parallel conductor runners formed by electrically connecting sections of runners to conductor runners on a different level of a multilayer circuit, so as to achieve a multilayer runner structure having an increased current-carrying capacity. Such a capability is particularly advantageous for conductor runners in critical areas of a multilayer circuit, such as thick film hybrid multilayer circuits with circuit devices whose input/output signals are carried by the multilayer runner. The multilayer runner can be one of a plurality of multilayer runners that form a conductor pattern for registering with such a circuit device. As a result, this invention enables one or more conductors of a conductor pattern to be highly conductive, even where the widths of the conductors are severely limited by the size of the circuit device with which the conductor pattern must register.

Another significant advantage of this invention is that the individual conductor layers may be formed from differing material, enabling the selection of compositions having different electrical conductivities and wire-bonding characteristics. As a result, a multilayer runner can be formed using a relatively high resistance top conductor layer that is readily wire-bondable and a lower resistance bottom conductor layer, yielding a multilayer runner characterized by relatively low electrical resistance, yet with the desirable processing and/or property characteristics of the top runner.

Yet another advantage of this invention is that multilayer runners of this invention can be formed using known materials and known processing methods, such as well known printing, trimming, soldering and fellow techniques used in the electronics industry. As a result, hybrid circuits processed in accordance with this invention can be mass produced for use in such industries as the automotive industry.

While our invention has been described in terms of a preferred embodiment, it is apparent that other forms could be adopted by one skilled in the art—for example, by employing alternate processing techniques, substituting appropriate materials, or employing the teachings of this invention in a multilayer circuit other than a thick film hybrid multilayer circuit. Accordingly, the scope of our invention is to be limited only by the following claims.

The embodiments of the invention in which an exclusive property or privilege is claimed are defined as follows:

1. A multilayer circuit comprising:

a substrate;

a multilayer conductor supported by said substrate, said multilayer conductor comprising at least two laterally extending conductor runners, each adjacent pair of conductor runners of said at least two conductor runners being separated by a dielectric material; and means for electrically interconnecting said at least two conductor runners at at least two locations, such that portions of said at least two conductor runners between said at least two laterally displaced locations are electrically in parallel to each other;

whereby said multilayer conductor is characterized by an electrical resistance between said at least two locations which is less than the electrical resistance of said at least two conductor runners when measured individually between said at least two locations.

2. A multilayer circuit as recited in claim 1 wherein said electrical interconnecting means comprises a pair of electrically conductive members extending through said dielectric material, each of said pair of electrically conductive members being located at a corresponding one of said at least two locations.

3. A multilayer circuit as recited in claim 1 wherein said multilayer circuit is a thick film hybrid multilayer circuit.

4. A multilayer circuit as recited in claim 1 further comprising a circuit device electrically interconnected with said multilayer conductor in proximity to one of said at least two locations.

5. A multilayer circuit as recited in claim 1 wherein said multilayer conductor is one of a plurality of multilayer conductors, said multilayer circuit further comprising a circuit device registered with said plurality of multilayer conductors.

6. A multilayer circuit as recited in claim 1 wherein said at least two conductor runners of said multilayer conductor are not geometrically in parallel between said at least two locations.

7. A thick film hybrid multilayer circuit comprising:

a substrate;

a multilayer conductor supported by said substrate, said multilayer conductor comprising first and second laterally extending conductor runners being separated by a dielectric material, said first conductor runner being intermediate said substrate and said dielectric material, said second conductor runner being at a surface of said thick film hybrid multilayer circuit;

vias formed through said dielectric material at at least two laterally displaced locations; and electrical conductors extending through said vias for electrically interconnecting said first and second conductor runners at said at least two locations, such that portions of said first and second conductor runners between said at least two locations are electrically in parallel to each other;

whereby said multilayer conductor is characterized by an electrical resistance between said at least two locations which is less than the electrical resistance of said first and second conductor runners when measured individually between said at least two locations.

8. A thick film hybrid multilayer circuit as recited in claim 7 wherein said first conductor runner is formed from a first material and said second conductor runner is formed from a second material, said first material being more electrically conductive than said second material.

9. A thick film hybrid multilayer circuit as recited in claim 7 wherein said first conductor runner is formed from a first material and said second conductor runner is formed from a second material, said second material being more readily wire-bondable than said first material.

10. A thick film hybrid multilayer circuit as recited in claim 7 wherein said first and second conductor runners of said multilayer conductor are not geometrically in parallel between said at least two locations.

11. A thick film hybrid multilayer circuit as recited in claim 7 further comprising a circuit device electrically interconnected with said second conductor runner in proximity to one of said at least two locations.

12. A thick film hybrid multilayer circuit as recited in claim 7 wherein said multilayer conductor is one of a plurality of multilayer conductors, said multilayer circuit further comprising a circuit device registered with said plurality of multilayer conductors.

13. A thick film hybrid multilayer circuit as recited in claim 12 wherein said circuit device comprises an integrated circuit chip.

14. A thick film hybrid multilayer circuit comprising:

a ceramic substrate;

a multilayer printed conductor supported by said substrate, said multilayer printed conductor comprising first and second conductor runners, said first and second laterally extending conductor runners being electrically insulated from each other by a dielectric material, said first conductor runner being intermediate said substrate and said dielectric material, said second conductor runner being at a surface of said thick film hybrid multilayer circuit;

vias formed through said dielectric material at two laterally displaced locations; and electrical conductors extending through said vias for electrically interconnecting said first and second conductor runners at said two locations, such that portions of said first and second conductor runners between said two locations are electrically in parallel to each other;

whereby said multilayer printed conductor is characterized by an electrical resistance between said two locations which is less than the electrical resistance of said first and second conductor runners when measured individually between said two locations.

15. A thick film hybrid multilayer circuit as recited in claim 14 wherein said first conductor runner is formed from a first material and said second conductor runner is formed from a second material, said first material being more electrically conductive than said second material.

16. A thick film hybrid multilayer circuit as recited in claim 14 wherein said first conductor runner is formed from a first material and said second conductor runner is formed from a second material, said second material being more readily wire-bondable than said first material.

17. A thick film hybrid multilayer circuit as recited in claim 14 wherein said first and second conductor runners of said multilayer conductor are not geometrically in parallel between said two locations.

18. A thick film hybrid multilayer circuit as recited in claim 14 further comprising a circuit device electrically interconnected with said second conductor runner at one of said two locations.

19. A thick film hybrid multilayer circuit as recited in claim 14 wherein said multilayer conductor is one of a plurality of multilayer conductors of a conductor pattern, said multilayer circuit further comprising a circuit device registered with said conductor pattern.

* * * * *